United States Patent
Kurihara

(10) Patent No.: US 6,721,370 B1
(45) Date of Patent: Apr. 13, 2004

(54) PHASE CORRECTION CIRCUIT FOR RADIO COMMUNICATION APPARATUS

(75) Inventor: Kazuhiro Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/421,851

(22) Filed: Oct. 20, 1999

(30) Foreign Application Priority Data

Oct. 21, 1998 (JP) .......................................... 10-299537

(51) Int. Cl.$^7$ .......................... H04L 25/03; H04L 25/49; H04L 27/10; H03D 3/00
(52) U.S. Cl. ..................... 375/297; 375/284; 375/322; 375/345; 332/103; 329/304
(58) Field of Search ................... 375/284, 285, 375/271, 261, 279, 280, 281, 297, 296, 302, 308, 322, 324, 326, 327, 329, 340, 344, 345, 346; 330/107, 149; 329/304; 332/103; 455/232.1, 234.1, 63, 296, 311

(56) References Cited

U.S. PATENT DOCUMENTS

| | | | | |
|---|---|---|---|---|
| 4,700,151 A | * | 10/1987 | Nagata | 332/123 |
| 5,093,637 A | * | 3/1992 | Isota et al. | 375/297 |
| 5,142,240 A | * | 8/1992 | Isota et al. | 330/149 |
| 5,509,030 A | * | 4/1996 | Mortensen | 375/345 |
| 5,787,362 A | * | 7/1998 | Matero | 455/553.1 |
| 6,373,902 B1 | * | 4/2002 | Park et al. | 375/296 |
| 6,587,513 B1 | * | 7/2003 | Ichihara | 375/296 |

FOREIGN PATENT DOCUMENTS

| | | |
|---|---|---|
| EP | 839 606 A2 | 10/1998 |
| GB | 2 240 893 A | 8/1991 |
| GB | 2 243 736 A | 11/1991 |
| GB | 0 559 093 A1 | 9/1993 |
| JP | 3-289220 | 12/1991 |
| JP | 04-023524 | 1/1992 |
| JP | 5-75541 | 3/1993 |
| JP | 5-183359 | 7/1993 |
| JP | 8-65352 | 3/1996 |
| JP | 8-102768 | 4/1996 |
| JP | 08-330868 | 12/1996 |
| JP | 9-247228 | 9/1997 |
| WO | WO 97/28598 | 8/1997 |

OTHER PUBLICATIONS

WPI English Language Abstract of SU1022289.

* cited by examiner

Primary Examiner—Betsy L. Deppe
(74) Attorney, Agent, or Firm—Scully, Scott, Murphy & Presser

(57) ABSTRACT

A phase correction circuit for a radio communication apparatus includes a variable gain amplifier and phase correction unit. The variable gain amplifier amplifies a transmission/reception signal on the basis of a gain variably set in accordance with a gain signal. The phase correction unit has a phase characteristic opposite to that of the variable gain amplifier, corrects the phase of the transmission/reception signal on the basis of the gain signal supplied to the variable gain amplifier, and cancels a phase change of the signal caused in the variable gain amplifier.

2 Claims, 4 Drawing Sheets

FIG.4A TRANSMISSION DATA

FIG.4B TRANSMISSION GAIN

FIG.4C PHASE CORRECTION AMOUNT

FIG.4D PHASE ROTATION AMOUNT OF TRANSMISSION SIGNAL

| S1 | S2 | S3 |
|---|---|---|
| G1 | G2 | G3 |
| $\phi1$ | $\phi2$ | $\phi3$ |
| $\phi T$ | | |

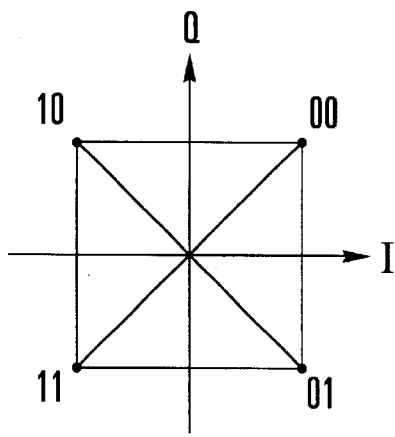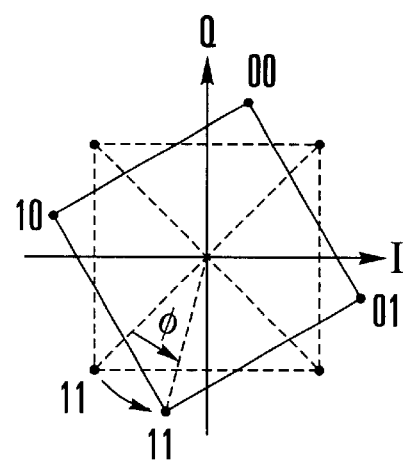
FIG.6A  FIG.6B
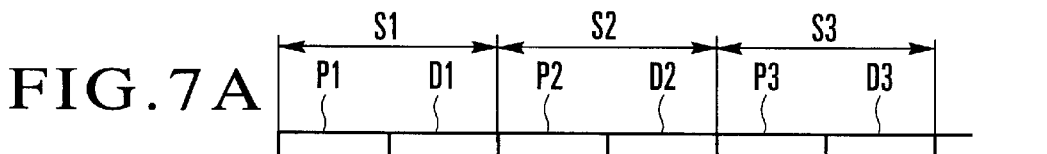
FIG.7A
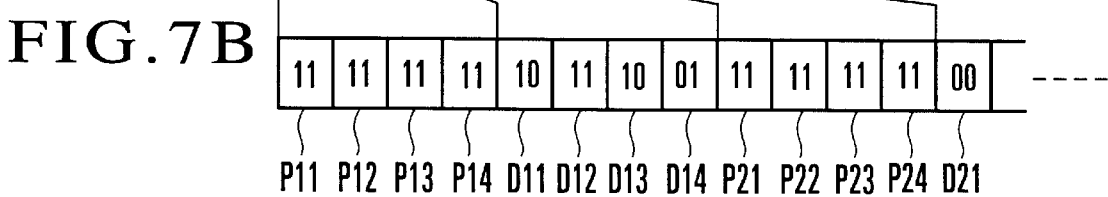
FIG.7B
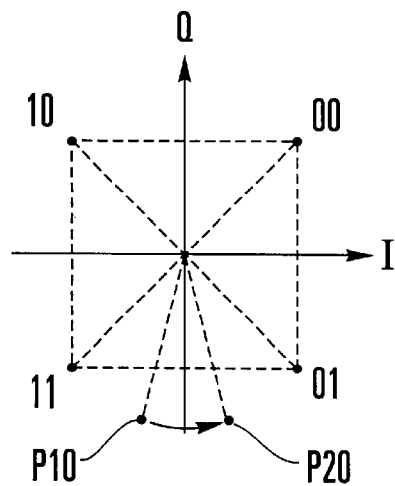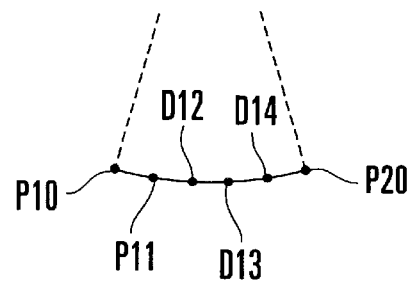
FIG.8A  FIG.8B

PHASE CORRECTION CIRCUIT FOR RADIO COMMUNICATION APPARATUS

BACKGROUND OF THE INVENTION

The present invention relates to a phase correction circuit for a radio communication apparatus and, more particularly, to a phase correction circuit for a radio communication apparatus that has a variable gain amplifier for amplifying a reception signal or transmission signal.

According to a conventional phase shift keying scheme such as a CDMA (Code Division Multiple Access) radio scheme used in digital radio communication systems, data is transmitted in correspondence with each phase of a carrier wave. For example, in a QPSK (Quadrature Phase Shift Keying) scheme, as shown in FIG. 6A, data "00", "10", "11", and "01" are transmitted while being assigned as symbols on the I-Q plane to $\pi/4$, $3\pi/4$, $5\pi/4$, and $7\pi/4$ phases, respectively.

In this case, the respective data shift from each other by a $\pi/4$ phase. While holding the phase differences between the respective symbols, only the entire phase, i.e., reference phase can be rotated by $\phi$, as shown in FIG. 6B. In interpolation synchronous detection used in this phase shift keying scheme, the reference phase is rotated for each slot set in a main signal, and rotated for each data in the slot.

FIGS. 7A and 7B show an example of the signal format according to the interpolation synchronous detection scheme, and FIGS. 8A and 8B show a phase change in the interpolation synchronous detection scheme.

In FIG. 7A, respective slots include PILOT portions P1 to P3 each representing the reference phase of a corresponding slot, and DATA portions D1 to D3 each representing transmission data. To detect this signal, the reference phases in respective slots, e.g., the phases of data "11" are detected from the PILOT portions P1 to P3 of the slots.

More specifically, in a slot S1, the PILOT portion P1 stores four pilot data "11" P11 to P14, as shown in FIG. 7B. A reference phase P10 of the slot S1 shown in FIG. 8A is detected from the average of these symbol positions. Similarly, a reference phase P20 of a slot S2 is detected. The interval from the detected reference phase P20 to the reference phase P10 of the preceding slot is divided by the number of data in the slot, as shown in FIG. 8B. The phase is gradually shifted for each data to establish synchronization.

This conventional radio communication apparatus employs a variable gain amplifier in the analog circuit of a modulator or demodulator. For this reason, a phase change caused by a dynamic gain change in the variable gain amplifier generates an error in reference phase detection based on the pilot signal. A detection error occurs every slot serving as a gain switching unit.

This is because the phase change amount of the variable gain amplifier changes depending on the gain, and the phase relationship between the input signal and output signal of the variable gain amplifier is unbalanced upon a gain change.

SUMMARY OF THE INVENTION

It is an object of the present invention to provide a phase correction circuit for a radio communication apparatus that reduces a phase change to prevent a detection error when the phase changes in a variable gain amplifier in accordance with a gain change.

To achieve the above object, according to the present invention, there is provided a phase correction circuit for a radio communication apparatus, comprising a variable gain amplifier for amplifying a transmission/reception signal on the basis of a gain variably set in accordance with a gain signal, and phase correction means, having a phase characteristic opposite to a phase characteristic of the variable gain amplifier, for correcting a phase of the transmission/reception signal on the basis of the gain signal supplied to the variable gain amplifier, and canceling a phase change of the signal caused in the variable gain amplifier.

BRIEF DESCRIPTION OF THE DRAWINGS

FIGS. 4A to 4D are views, respectively, showing phase correction operation of the radio communication apparatus shown in FIG. 3;

FIGS. 6A and 6B are graphs, respectively, showing the phase relationship in the QPSK scheme;

FIGS. 7A and 7B are views, respectively, showing the signal format by the interpolation synchronous detection scheme; and FIGS. 8A and 8B are views, respectively, showing a phase change in the interpolation synchronous detection scheme.

DESCRIPTION OF THE PREFERRED EMBODIMENTS

The present invention will be described in detail below with reference to the accompanying drawings.

Figure 1A:
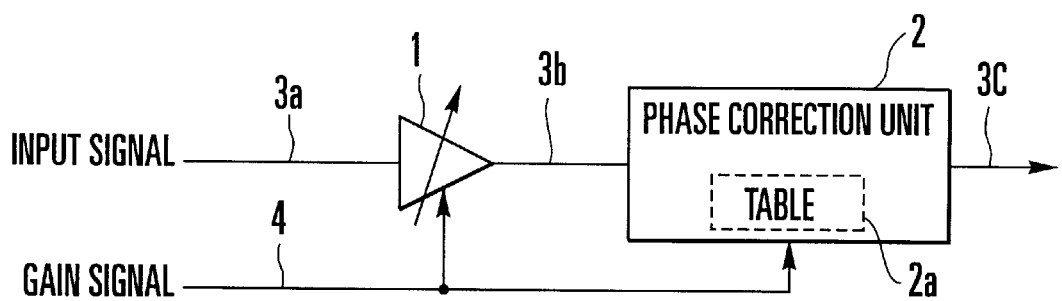
FIG. 1A is a block diagram showing the phase correction circuit for a radio communication apparatus according to the first embodiment of the present invention.

FIG. 1A shows the phase correction circuit for a radio communication apparatus according to the first embodiment of the present invention. In FIG. 1A, a variable gain amplifier (to be referred to as an amplifier) 1 is one of elements constituting the analog circuit of the radio communication apparatus. The amplifier 1 changes in gain in accordance with a gain signal 4, converts an analog input signal 3a as a reception/transmission signal into an output signal 3b having a predetermined magnitude (e.g., amplitude), and outputs the output signal 3b.

In this reception case, the gain signal 4 is controlled based on the magnitude of the input signal 3a to constitute an AGC (Auto Gain Control) amplifier. For example, when a small input signal 3a is input, a gain signal 4 exhibiting a high gain is supplied to the amplifier 1. When a large input signal 3a is input, a gain signal 4 exhibiting a low gain is supplied. Accordingly, the amplifier 1 can output the output signal 3b having an almost constant magnitude.

Figure 1B:
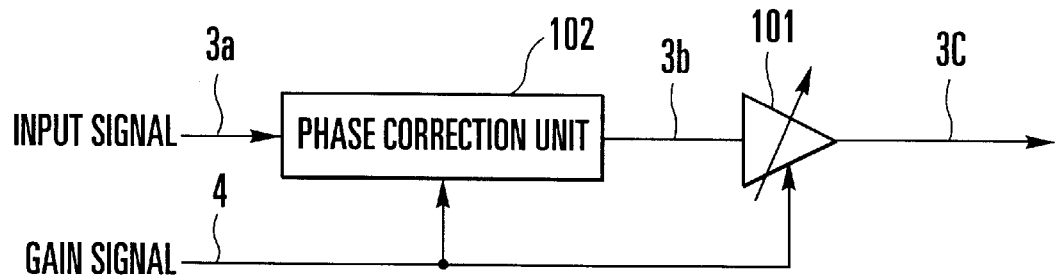
FIG. 1B is a block diagram showing a modification of the circuit in FIG. 1A.

A phase correction unit 2 corrects a phase change of the output signal 3b generated upon a gain change of the amplifier 1, on the basis of a phase characteristic opposite to that of the amplifier 1. In FIG. 1A, the phase correction unit 2 is arranged on the subsequent stage (output stage) of the amplifier 1. Alternatively, a phase correction unit 102 may be arranged on the preceding stage (input stage) of a variable gain amplifier 101, as shown in FIG. 1B.

Figure 2:
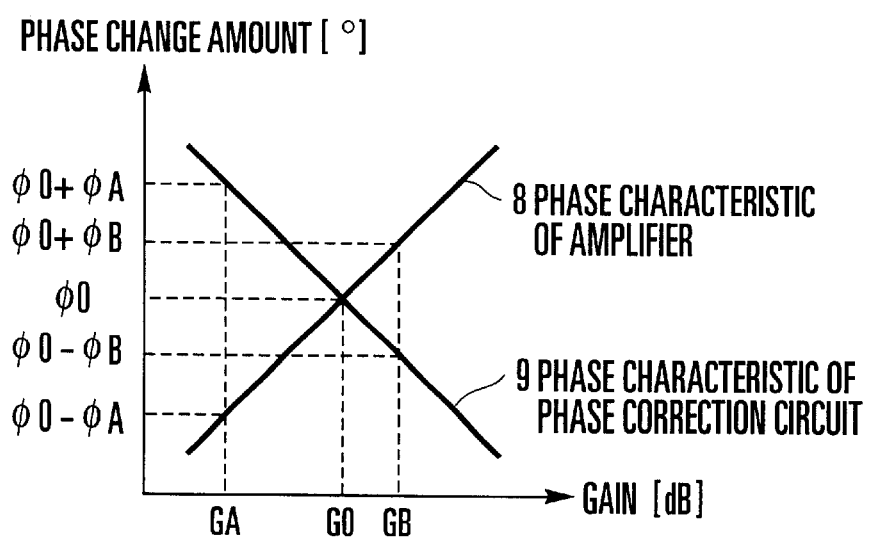
FIG. 2 is a graph for explaining the phase characteristic of the phase correction unit shown in FIG. 1A.

FIG. 2 shows the phase characteristic of the phase correction unit 2. If the phase change of the output signal 3b from the amplifier 1 is always kept constant with respect to the input signal 3a regardless of the gain, the signal phase does not relatively change. In practice, however, the phase change amount also varies upon a gain change of the amplifier 1.

The phase correction unit 2 exhibits a phase characteristic 9 having a change amount opposite in polarity to the phase change amount, i.e., a phase characteristic 8 with respect to the gain of the amplifier 1. The phase correction unit 2 corrects the phase of the output signal from the amplifier 1 using the phase characteristic 9. That is, when the phase change amounts of the amplifier 1 for gains G0, GA, and GB are Φ0, Φ0−ΦA, and Φ0+ΦB, respectively, the phase correction amounts of the phase correction unit 2 are set to Φ0, Φ0+ΦA, and Φ0−ΦB for these gains, respectively.

The phase change amount of the signal always converges to 2×Φ0 in an output signal 3c from the phase correction unit 2. Hence, even if the gain of the variable gain amplifier 1 dynamically changes, the output signal 3c in which a relative phase change between the input signal 3a and output signal 3b of the variable gain amplifier 1 is suppressed can be obtained.

In the phase correction unit 2, the phase characteristic 9 for the gain signal 4 of the amplifier 1 can be prepared in a table 2a to digitally correct the phase on the baseband. Alternatively, the phase characteristic 9 may be given as a function by a circuit or arithmetic expression to obtain the phase correction amount by arithmetic processing or the like using the gain signal 4 as an input.

Figure 3:
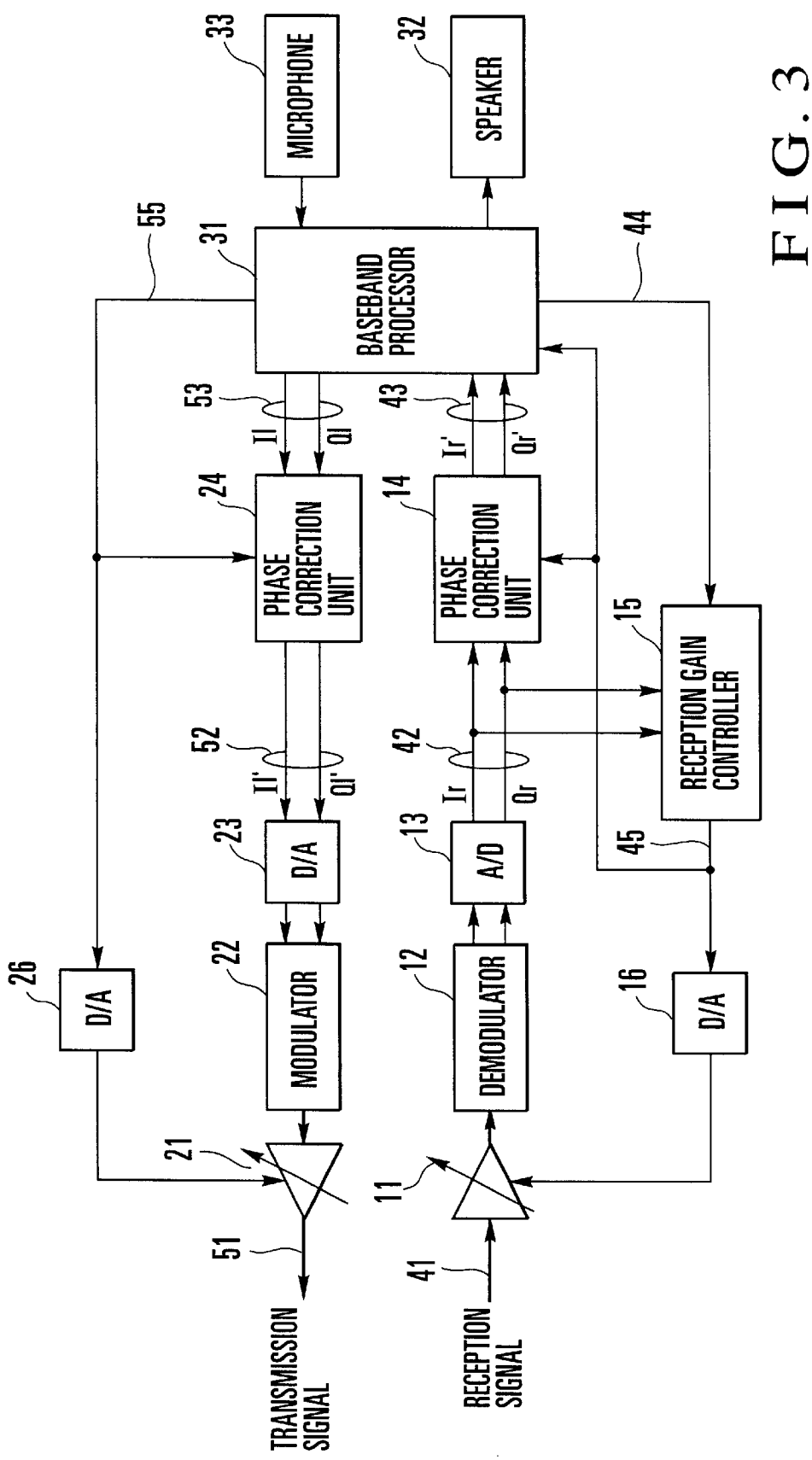
FIG. 3 is a block diagram showing a radio communication apparatus according to the second embodiment of the present invention.

FIG. 3 shows a radio communication apparatus based on the QPSK (Quadrature Phase Shift Keying) scheme according to the second embodiment of the present invention.

As described above, a radio communication system using a multi-phase shift keying scheme such as the QPSK scheme must more accurately control the phase. The system must reduce a phase change caused by a variable gain amplifier used in the input stage of a receiving-side demodulator or the output stage of a transmitting-side modulator.

In the second embodiment, a reception signal phase correction unit for correcting the phase of a digital reception signal is adopted to make digital signal processing correct a phase change caused by the variable gain amplifier. Further, a transmission phase correction unit for correcting the phase of a transmission signal before analog conversion is adopted to make digital signal processing correct a phase change caused by the variable gain amplifier.

In FIG. 3, on the receiving side, a reception signal 41 received via an antenna (not shown) is amplified by a variable gain amplifier (to be referred to as an amplifier) 11, and demodulated by a demodulator 12. An output from the demodulator 12 is digitized by an A/D converter 13 to generate a reception signal 42 having Ir and Qr components on an I-Q plane. A phase correction unit 14 corrects the phases of the Ir and Qr components of the reception signal 42 on the basis of a gain signal 45 from a reception gain controller 15 (to be described below), and generates a reception signal 43 having Ir' and Qr' components. The reception signal 43 is output to a baseband processor 31.

The baseband processor 31 recognizes, based on the phase-corrected reception signal 43, PILOT portions P1 to P3 and DATA portions D1 to D3 of respective slots, which have been described with reference to FIGS. 7A and 7B. If the DATA portion stores audio information, the audio information is decoded into an audio signal and output from a speaker 32. At this time, the reception gain controller 15 detects the magnitude of the reception signal 41 on the basis of the reception signal 42 output from the A/D converter 13, and calculates the gain of the amplifier 11 for each slot of the reception signal 41 so as to optimize the magnitude of the reception signal 41.

The reception gain controller 15 outputs the gain signal 45 digitally exhibiting the gain of the amplifier 11 on the basis of a timing signal 44 from the baseband processor 31 so as to synchronize the gain of the amplifier 11 with each slot. A D/A converter 16 converts the gain signal 45 from the reception gain controller 15 into an analog signal, and outputs the analog signal to the amplifier 11. As a result, the reception signal 41 is amplified to an appropriate magnitude, and output to the demodulator 12.

The gain signal 45 from the reception gain controller 15 is further output to the phase correction unit 14. The phase correction unit 14 corrects the phase of the reception signal 42 in accordance with the gain signal 45 in synchronism with a gain change of the amplifier 11. A phase change in the amplifier 11 is corrected for each slot by the phase correction unit 14, and the reception signal 43 in which the phase change is suppressed is supplied to the baseband processor 31.

On the transmitting side, an audio signal input from a microphone 33 is encoded by the baseband processor 31 and stored in the DATA portions D1 to D3 of slots. The DATA portions D1 to D3 are converted together with PILOT portions P1 to P3 each having a fixed signal such as "11", into a transmission signal 53 having It and Qt components on the I-Q plane, and the transmission signal 53 is output. The baseband processor 31 outputs a gain signal 55 representing the gain of a variable gain amplifier (to be referred to as an amplifier) 21 to a phase correction unit 24 and D/A converter 26 so as to synchronize the gain of the amplifier 21 with each slot.

The phase correction unit 24 corrects in advance the phases of the It and Qt components of the transmission signal 53 in accordance with the gain signal 55, and generates a phase-corrected transmission signal 52 having It' and Qt' components. A D/A converter 23 converts the transmission signal 52 from the phase correction unit 24 into an analog signal, and outputs the analog signal to a modulator 22. The amplifier 21 amplifies an output from the modulator 22 on the basis of the gain signal 55 for each slot, and outputs the amplified output as a transmission signal 51 to an antenna (not shown).

Accordingly, a phase change in the amplifier 21 is corrected in advance for each slot by the phase correction unit 24 to output the transmission signal 51 having an appropriate magnitude in which the phase change is suppressed. Note that the power of the transmission signal 51 is determined by the baseband processor 31 based on the magnitude of the reception signal 41 or information of the reception signal 41 instructed from a base station.

For example, in the digital radio communication system such as the CDMA radio scheme, a method of controlling the transmission power of a mobile station to a proper value includes open-loop control of determining the transmission power by the mobile station itself in accordance with the reception level of a signal transmitted from the base station. In this open-loop control, the distance between the base station and mobile station is determined from the signal level from the based station to determine a proper transmission power.

In addition, the transmission power control method includes closed-loop control of determining the transmission power by the mobile station in accordance with an instruction from the base station. In the closed-loop control, the reception level of a signal transmitted from the mobile station is detected by the base station, and the base station informs the mobile station of information representing an increase/decrease in transmission power until the reception level reaches an optimal value.

By using these methods, the baseband processor 31 determines the magnitude of the transmission signal 51, and generates the gain signal 55 representing the gain of the variable gain amplifier 21.

FIGS. 4A to 4D show phase correction operation on the transmitting side. As shown in FIGS. 4A and 4B, when a slot S1 has a transmission gain G1, the transmission gain G1 is informed of by the gain signal 55 from the baseband processor 31 to the phase correction unit 24. The phase correction unit 24 sets a phase correction amount $\Phi 1$ corresponding to the gain G1, as shown in FIG. 4C.

Figure 5:
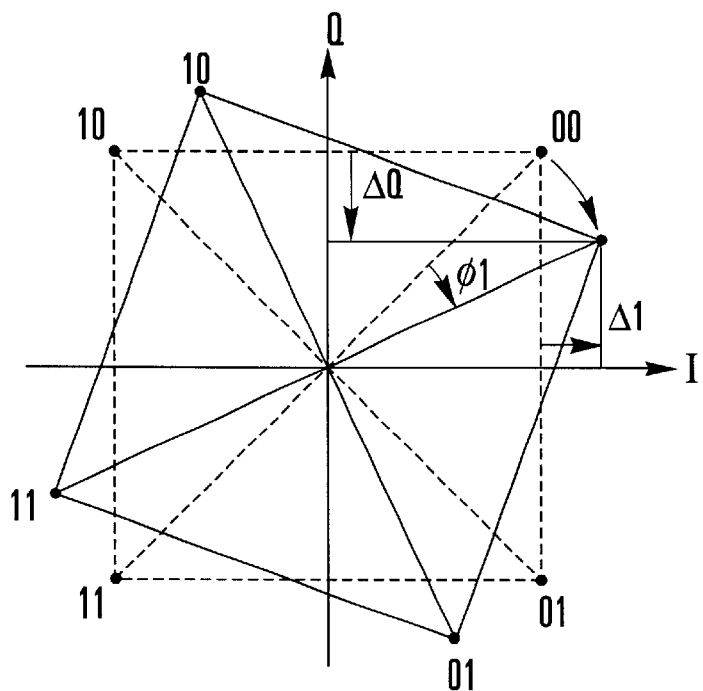
FIG. 5 is a graph showing an example of phase correction.

The phase correction unit 24 corrects the phase by $\Phi 1$ so as to cancel the phase change amount of the transmission signal for the gain G1 of the amplifier 21. As a result, a phase rotation amount $\Phi T$ of a desired transmission signal is obtained, as shown in FIG. 4D. In this case, as shown in FIG. 5, the phase correction unit 24 corrects the phase of the transmission signal by only increasing/decreasing the digital It and Qt components on the I-Q plane by $\Delta I$ and $\Delta Q$, respectively.

According to the second embodiment, the phase is corrected in a section where a reception signal and transmission signal are processed as digital values. The phase can be easily corrected, compared to the case of correcting the phase of an analog signal.

In this embodiment, the phase correction units 14 and 24 are arranged separately from the baseband processor 31, and digitally correct the phase. Instead, the baseband processor 31 may internally perform phase correction operation.

As has been described above, according to the present invention, even when the gain of a variable gain amplifier dynamically changes, the phase change amount of a signal generated by a gain change in the variable gain amplifier can be reduced to prevent a detection error caused by the phase change.

What is claimed is:

1. A phase correction circuit for a radio communication apparatus, comprising:

a variable gain amplifier for amplifying a reception signal on the basis of a gain variably set in accordance with a gain control signal;

demodulation means for demodulating the amplified reception signal (outputted from said variable gain amplifier) into I and Q components on an I-Q plane;

A/D conversion means for converting the I and Q components output from said demodulation means into digital signals; and phase correction means, having a phase characteristic opposite to a phase characteristic of said variable gain amplifier, for increasing/decreasing the digital I and Q components output from said A/D conversion means on the basis of the gain control signal supplied to said variable gain amplifier, and canceling a phase change of the reception signal caused by said variable gain amplifier.

2. A phase correction circuit for a radio communication apparatus, comprising:

a variable gain amplifier for amplifying a transmission signal on the basis of a gain variably set in accordance with a gain control signal;

D/A conversion means for converting digital I and Q components on an I-Q plane into analog signals;

modulation means for modulating the analog I and Q components output from said D/A conversion means, and outputting the modulated I and Q components as the transmission signal to said variable gain amplifier; and phase correction means, having a phase characteristic opposite to a phase characteristic of said variable gain amplifier, for increasing/decreasing the digital I and Q components output to said D/A conversion means on the basis of the gain control signal supplied to said variable gain amplifier, and canceling a phase change of the transmission signal (outputted from said variable gain amplifier) caused by said variable gain amplifier.

* * * * *